United States Patent
Thorslund et al.

(10) Patent No.: US 11,078,894 B2
(45) Date of Patent: Aug. 3, 2021

(54) MICROFLUIDIC FAN

(71) Applicant: Chillwind Technologies AB, Uppsala (SE)

(72) Inventors: Robert Thorslund, Steningehöjden (SE); Peter Nilsson, Sundbyberg (SE); Are Björneklett, Västerås (SE)

(73) Assignee: Chillwind Technologies AB

( * ) Notice: Subject to any disclaimer, the term of this patent is extended or adjusted under 35 U.S.C. 154(b) by 233 days.

(21) Appl. No.: 15/578,643

(22) PCT Filed: May 20, 2016

(86) PCT No.: PCT/SE2016/050466
§ 371 (c)(1),
(2) Date: Nov. 30, 2017

(87) PCT Pub. No.: WO2016/195571
PCT Pub. Date: Dec. 8, 2016

(65) Prior Publication Data
US 2018/0135613 A1 May 17, 2018

(30) Foreign Application Priority Data
Jun. 3, 2015 (SE) .................................. 1550715-5

(51) Int. Cl.
*F04B 37/10* (2006.01)
*H01L 23/467* (2006.01)
(Continued)

(52) U.S. Cl.
CPC .............. *F04B 37/10* (2013.01); *F04B 19/00* (2013.01); *F04B 19/006* (2013.01); *F04B 39/06* (2013.01);
(Continued)

(58) Field of Classification Search
CPC ........ F04B 39/06; F04B 19/00; F04B 19/006; F04B 37/10; H01L 23/467; H01L 23/473; H05K 7/20172; H21V 29/63; F28F 13/16
See application file for complete search history.

(56) References Cited

U.S. PATENT DOCUMENTS 4,227,894 A 10/1980 Proynoff
4,504,446 A * 3/1985 Kunicki .................. C01B 13/11
422/186.18
(Continued)

FOREIGN PATENT DOCUMENTS

CN 1934359 A 3/2007
CN 101622687 A 1/2010
(Continued)

OTHER PUBLICATIONS

JP 2014-212624 A, Cited in Office Action dated Jun. 30, 2020, in related Japanese Patent Application No. 2018-515757.

Primary Examiner — Charles G Freay
(74) Attorney, Agent, or Firm — Condo Roccia Koptiw LLP

(57) ABSTRACT

A device (1, 100) for controlling a flow of a gaseous fluid is disclosed. The device comprises a first electrode (10, 110) and a second electrode (20, 120) offset from the first electrode in a downstream direction of the flow. The electrodes are connectable to a voltage source. A thermally conducting flange (30) is arranged to extend in a plane parallel to a direction of the flow and adapted to dissipate heat from the gaseous fluid. At least a portion of the first electrode has a maximum height ($h_1$) in a direction parallel to a direction of the flow and a maximum width ($w_1$) in a direction orthogonal to the direction of the flow, wherein said maximum height is larger than said maximum width so as to improve the pumping efficiency of the device. A
(Continued)

method for manufacturing the device, and a method for controlling a fluid flow by means of such device, is also disclosed.

16 Claims, 5 Drawing Sheets

(51) Int. Cl.
*F04B 39/06* (2006.01)
*F04B 19/00* (2006.01)
*H05K 7/20* (2006.01)
*F21V 29/63* (2015.01)

(52) U.S. Cl.
CPC ....... *H01L 23/467* (2013.01); *H05K 7/20172* (2013.01); *F21V 29/63* (2015.01)

(56) References Cited

U.S. PATENT DOCUMENTS

| | | | |
|---|---|---|---|
| 4,689,056 A | 8/1987 | Noguchi et al. | |
| 5,964,997 A | 10/1999 | McBride | |
| 7,909,583 B2 | 3/2011 | Sugimoto et al. | |
| 2004/0170542 A1 | 9/2004 | Taylor | |
| 2008/0060794 A1 | 3/2008 | Wei | |
| 2008/0175720 A1* | 7/2008 | Schlitz | F04D 33/00 417/48 |
| 2010/0116469 A1* | 5/2010 | Jewell-Larsen | F04B 19/006 165/104.34 |
| 2010/0155025 A1* | 6/2010 | Jewell-Larsen | F28F 13/16 165/96 |
| 2010/0177519 A1 | 7/2010 | Schlitz | |
| 2011/0094710 A1* | 4/2011 | Choudhary | H01T 23/00 165/96 |
| 2011/0116206 A1* | 5/2011 | Kim | H01L 23/467 361/231 |
| 2012/0007742 A1 | 1/2012 | Gooch et al. | |
| 2015/0114608 A1 | 4/2015 | He et al. | |
| 2019/0257823 A1* | 8/2019 | Glezer | C12Q 1/485 |

FOREIGN PATENT DOCUMENTS

| | | |
|---|---|---|
| JP | 2000-222072 A | 8/2000 |
| JP | 2008-529284 A | 7/2008 |
| JP | 2012057872 A | 3/2012 |
| JP | 2014-212624 A | 11/2014 |
| JP | 2014212625 A | 11/2014 |
| WO | 2006/079111 A2 | 7/2006 |
| WO | WO-2007112763 A1 * | 10/2007 ......... H05K 7/20172 |
| WO | WO 2011/058411 A2 | 5/2011 |

\* cited by examiner

MICROFLUIDIC FAN

CROSS REFERENCE TO RELATED APPLICATIONS

This application is the National Stage Entry under 35 U.S.C. § 371 of Patent Cooperation Treaty Application No. PCT/SE2016/050466, filed 20 May 2016, which claims the benefit of Sweden Application No. 1550715-5, filed 3 Jun. 2015, the contents of which are hereby incorporated by reference herein.

FIELD OF THE INVENTION

The invention disclosed herein relates to devices for cooling gaseous fluids. More precisely, it relates to an electro-hydrodynamic device for controlling and cooling a flow of a gaseous fluid, as well as methods for manufacturing and controlling such device.

BACKGROUND OF THE INVENTION

The performance of electronic systems is to a large extent limited by the available cooling techniques for keeping the electronics within an appropriate temperature range. Smaller electronic devices having improved performance are associated with increased heat dissipation over a relatively small area. In other words, there is a growing need for space and energy efficient cooling of electronic devices.

As an example, satellites, such as telecommunication satellites, are approaching the technology limits of existing on-board thermal management systems. The power dissipation of these satellites increases to meet the growing requirements for broadcasting, broadband multimedia and mobile communications services. Micro, nano, or 'cube' satellites, which require low-mass heat removal from electronic components (satellite on a chip) are likely to need more compact thermal management systems for maintaining a high performance.

Cooling is also a crucial factor for electronics, such as e.g. WiFi routers and computers, and for semiconductor lighting devices such as light emitting diodes (LEDs), for which the removal of excess heat is desired to provide proper light output and achieve expected lifetimes. In many LED lighting applications, heat is removed using heat sinks to draw heat away from the LEDs and to dissipate it into the surrounding air. However, such passive cooling may not be sufficient for higher power LEDs, which may require higher levels of cooling than what conventional heat sinks can provide. Further, heat sinks and thermal spreaders may be space-consuming, add weight and often need specific orientation for optimum performance.

These issues have been addressed using active cooling systems using forced flows of air or other fluids so as to improve the cooling efficiency. One example of such active cooling systems includes electrohydrodynamical (EHD) pumps wherein ionized particles or molecules interact with electric fields and entrain a flow of a cooling medium.

Even though such EHD pumps may be employed in various cooling applications, there is still a need for an improved device and method for controlling the flow of a gaseous fluid and for providing improved cooling efficiency. There is also a need for an improved manufacturing method of such devices.

SUMMARY OF THE INVENTION

It is an object of the present invention to control the flow of a gaseous fluid in such manner that the efficiency of the transportation and cooling of the gaseous fluid is improved.

Accordingly, the invention provides a device and a control method with the features of the independent claims. The dependent claims define advantageous embodiments.

In a first aspect, a device for controlling a flow of a gaseous fluid is provided. The device comprises a first electrode and a second electrode, wherein at least a portion of the second electrode is offset from at least a portion of the first electrode in a downstream direction of the flow and wherein the electrodes are connectable to a voltage source. The device further comprises at least one thermally conducting flange that extends in a plane parallel to a direction of the flow and is adapted to dissipate heat from the gaseous fluid. The first electrode comprises at least a portion which has a maximum height in a direction parallel to the direction of the flow, and a maximum width in a direction orthogonal to the direction of the flow, wherein the maximum height is larger than the maximum width, preferably at least twice the maximum width. The maximum height may also be three, four, five, or six times the maximum width, or larger.

In a second aspect, a method for manufacturing a device according to the first aspect is provided.

In a third aspect, a method for controlling the flow of a gaseous fluid is provided. The method comprises providing a device according to the first aspect, providing a gaseous fluid contacting the first electrode of the device, and applying an electric potential difference between the first electrode and the second electrode.

By the term "flange" should be understood an essentially sheet-formed structure extending in a plane at least partly parallel to a main direction of the gaseous flow. Further, "thermally conductive" refers to the ability to receive heat energy from e.g. the gaseous fluid passing by the flange, and to transfer the received heat energy away from the interface between the gaseous fluid and the flange. The flange may be obtained by e.g. bending, injection moulding, milling, or any other suitable manufacturing techniques.

By the term "direction of flow" or "flow direction" should be understood the main direction of the resulting net flow of gaseous fluid passing through the device during operation. The term may also be referred to as "intended direction of flow".

Several advantages are associated with the invention. Firstly, by forming a first electrode having a relatively large height in relation to its width, a relatively high electric field concentration may be achieved, which may enhance the injection of ions to the surrounding fluid. Further, a relatively high electric field concentration may enhance the flow of the pumped fluid. Secondly, by arranging a thermally or heat conducting flange such that its main orientation or extension is essentially parallel to the direction of the fluid flow, a surface or interface of thermal interaction between the gaseous fluid and the flange may be increased so as to provide an improved transfer of heat. The larger surface of thermal interaction, the higher cooling efficiency may be achieved. Thirdly, a relatively high and narrow first electrode may reduce a flow resistance of the device, as the passing fluid may be exposed to a relatively small electrode area as seen in a transversal direction of the flow.

In one example, at least one portion of the first electrode may comprise a tapered portion forming an edge or tip that is directed towards the second electrode. By providing the first electrode with beaked or pointed portions, the injection of electrons per unit area of the first electrode into the gaseous fluid may be improved. Increasing the emitting of electrons may enhance the electrohydrodynamic effect, increase the flow through the device, and thus improve its pumping and/or cooling efficiency. Further, increasing the electron emitting efficiency from the first electrode may advantageously allow for a reduction of the flow resistance through or by the first electrode, since the open area, i.e. the area through which the fluid may pass, may be reduced without necessarily reducing the injected current.

Further, the first electrode may comprise at least one portion having a tapered portion forming an edge or tip directed away from the second electrode. In other words, the tapered portion is directed or pointed in a direction opposite to the direction of the flow of the fluid, which advantageously may streamline the upstream portion of the grid so as to reduce the flow resistance and enhance the efficiency of the device. In one example, at least a portion of the first electrode comprises a channel, or a plurality of channels, adapted to allow the fluid to flow through said channel. By arranging a passage through the material of the first electrode, the flow may be increased and/or the fluid resistance reduced.

The distance, or spacing, between the first and the second electrode may be varied so as to control the strength of the electric field being induced between the electrodes. Experiments have shown that a smaller gap, and thus a stronger induced electric field, may enable increased pump efficiency, or flow rate, as compared to devices having a larger gap and being supplied with the same electric power. The spacing may e.g. be within the range of 10-3000 µm, and more preferably in the range of 400-2000 µm.

According to an embodiment, the first electrode may comprise bridges and joints forming a grid structure which may be arranged to allow the gaseous fluid to pass through the first electrode, and wherein the portion of the first electrode forms part of at least one of the bridges.

By "grid" is understood any structure comprising bridges that are joined to each other so as to e.g. a grating, net, or honeycomb structure, etc. The bridges and the joints may define open areas of the grid which may admit a fluid flow. Further, it is understood that the grid may comprise several bridges having the above specified ratio between their height and width, or gauge. As an example, the whole grid other than its peripheral portions may e.g. be formed of such bridges. In another example, most of or all of bridges of the grid may fulfil the maximum height/gauge relation.

By forming a grid of bridges that have a relatively large height in relation to their width, the grid may be relatively rigid in terms of its ability to carry loads in the height direction of the bridges, or the direction of the flow. Thereby, a relatively rigid electrode is enabled, which may be less prone to bend or deform, especially in the direction of the flow, and hence the risk for e.g. short-circuiting of the device may be reduced. Further, the relatively rigid and stable grid may still have a relatively large open area which may provide a relatively low flow resistance being met by the fluid passing through the grid. Further, the relatively high and narrow bridges may reduce the amount of material required for forming a relatively stable and rigid grid, which may reduce both weight and cost of the device. By using a relatively rigid grid, the need for additional support structures may be reduced and a relatively well defined and constant spacing between the first and second electrodes may be achieved.

Due to their relatively large height, the bridges may also provide a relatively large contact surface between the grid structure and the passing fluid, which may facilitate any interactions between the electrode and the fluid, such as e.g. diffusion of material and/or injection of ions or electrons.

According to an embodiment, the first electrode may be formed as a rod having a height or length corresponding to the maximum height and width, or thickness, corresponding to the maximum width. The rod may e.g. be formed as a cylinder, pillar or needle, and may be hollow, solid, or porous. In one example, the rod may be adapted to let a flow of gaseous fluid pass through its interior. Furthermore, the rod may have a tapered or pointed end portion, preferably in a direction of the fluid flow. In a further example, the first electrode may be formed of or comprise a plurality of rods, which e.g. may be arranged such to have a length extension essentially parallel to the fluid flow, and/or arranged in a two or three dimensional array. Using a plurality of rods, and hence a plurality of emitting points, is advantageous in that is may increase the redundancy of the emitter.

According to an embodiment, the first electrode may be formed as a rod having a circular or polygonal cross section in a plane intersecting the direction of the flow.

According to some embodiments, the device comprises a plurality of flanges which e.g. may be arranged in a lamellar structure arranged to allow the gaseous fluid to pass through the device. Alternatively or additionally, the device may comprise a plurality of mutually intersecting flanges and/or flanges that are at least partly arranged around at least a portion of the first electrode. This allows the first electrode to be at least partly received by, or arranged within, a volume defined by the flanges so as to save space.

According to an embodiment, the second electrode is electrically connected to the thermally conducting flange. The flange may e.g. be at least partly electrically conducting and may thereby act as an extended second electrode.

According to an embodiment, the second electrode may be integrally formed with the thermally conducting flange, i.e., formed in one piece with the flange. The second electrode may in such case be considered to function both as a second electrode and a heat conducting or cooling flange. Integrating the electrical function of the second electrode with the flange may advantageously allow for a device requiring less space and/or less number of distinct parts, which may facilitate manufacturing and save costs.

According to some embodiments, at least one of the first and second electrodes may comprise a structured surface portion facing e.g. the other one of the electrodes. The structured surface portion may comprise micro- and/or nanostructures which may increase the area of the surface portion. The microstructures and/or nanostructures may for example include the geometrical form of hills, ridges, paraboloids, pillars, or trenches. Increasing surface area of the electrodes is advantageous in that it may improve the ability of emitting and/or collecting electrons and hence improve the efficiency of the electrode. Further, by increasing the surface area by means of micro- and/or nanostructures, a relatively higher active surface area can be achieved on a relatively small surface portion. This advantageously allows for a relatively larger active surface area and a relatively lower flow resistance. A relatively larger active area may also increase the lifetime of the electrode, since it may then be less sensitive to contaminants passivating the surface.

According to an embodiment, the second electrode comprises a concave surface portion facing the first electrode. A concave surface portion is advantageous in that it may provide an increased surface area as compared to a flat surface portion, thereby enhancing the ability to collect electrons, e.g., electrons emitted by the first electrode. The concave surface may e.g. conform to an arc of a circle, or a surface of a sphere or of a cylinder, having its centre or symmetry axis at an edge or tip of the first electrode.

Thereby, a homogenous electric field may be achieved between the first electrode and the second electrode.

According to an embodiment, the device may comprise a support structure arranged to separate the second electrode from the first electrode in the direction of the flow. The support structure may e.g. be electrically non-conductive and have a well defined thickness so as to maintain a desired spacing between the first and second electrodes. The support structure may e.g. be formed as a grid or a spacer comprising e.g. ceramics or polymers, and the first and/or second electrode(s) may be connected to or arranged on the support structure by means of e.g. welding, press-fitting, gluing, soldering, brazing, glazing or sintering. The support structure may comprise an alignment structure adapted to align the first electrode with the second electrode, and/or to align several stacked devices with each other. The alignment structure may e.g. comprise a protruding member and a receiving member, such as a depression or recess, wherein the protruding member is adapted to cooperate with a corresponding receiving member of another support structure, and vice versa. Thereby the assembling and alignment of the electrodes and/or the device may be facilitated.

According to further embodiments, at least one of the first electrode, the second electrode and the support structure comprises a suspension structure, or deformation structure, arranged to mitigate or compensate for thermally induced stresses, particularly in a plane orthogonal to the direction of the fluid flow and/or in a main length direction of at least a portion of the first or second electrodes. The deformation structure may e.g. be formed by a bridge being curved in the plane orthogonal to the direction of the flow. As the bridge is exposed to stresses or torsional torques in the plane orthogonal to its height (i.e. the flow direction), the bridge may due to its relatively large height and small gauge tend to deform in that plane rather than in the flow or height direction. Alternatively, the suspension structure is adapted to apply a tensile stress to the electrode such that it may maintain its shape in a main length direction during thermal expansion. The deformation (or suspension) structure advantageously allows for a device being less sensitive to thermally induced stresses and thermal expansion. Thereby a device having relatively well defined dimensions and a relatively reliable shape may be achieved. Furthermore, the deformation structure may allow materials having different coefficients of thermal expansion (CTE) to be combined. As an example, the first and/or the second electrodes may be formed of a material having a first CTE whereas the support structure, to which the first and/or the second electrodes may be attached, may have another CTE. In such case, a deformation structure may be provided in the electrodes and/or the support structure so as to enable any internal thermal stresses that may be caused by the difference in CTE to be absorbed by the deformation structure being deformed in the plane orthogonal to the direction of the fluid flow. Thus, the deformation structure may enable a more reliable device having a prolonged life.

According to an embodiment, the first electrode and/or the second electrode and/or the support structure is formed of a material that is selectively deposited so as to form the desired structure. The material may e.g. comprise a stacked structure of one or several metals. The depositing method may e.g. comprise molding, plating, screen printing, glazing, sputtering, evaporation or sintering.

Alternatively, or additionally, the manufacturing may comprise removal of material, e.g. by selectively removing material from a substrate. Examples of suitable techniques may include cutting, milling, etching, and abrasive blasting.

The first and/or second electrodes may advantageously comprise a material that has a relatively good ability of emitting electrons and is chemically stable, or inert, in relation to the pumped fluid. Further, the material may have a relatively high temperature resistance. Examples of such materials may include e.g. Pt, Au, Ni, W, Zr and stainless steel.

According to an embodiment, the device may comprise a heat transferring element arranged to transfer heat from at least one of the first electrode and the second electrode to a substrate in order to improve the cooling efficiency of the device. The heat transferring element may e.g. be formed of a metal plate arranged between the device and a printed circuit board.

According to an embodiment, the applied electric potential difference between the first and the second electrodes may be varied as a function of time. Experiments have shown that by e.g. alternating the potential difference between a first, positive value and zero, and/or between a positive and a negative value, the fluid flow per unit area, and hence the pump efficiency, may be improved due to improved electrical relaxation of the electrodes.

In one example, the device and an electrical component, such as a component to be cooled, may be connected to a common electrical potential, such as e.g. ground.

Examples of gaseous fluids that can be pumped by means of embodiments of the inventions include e.g. dielectrics such as nitrogen, helium, oxygen, argon and carbon dioxide, and any mixes thereof. In one example, the gaseous fluid comprises ambient air.

It will also be appreciated that embodiments of the invention may comprise a plurality of device according to any one of the embodiments below, arranged in an array or matrix on a substrate such as a PCB. Such array of device may e.g. provide cooling of multiple electrical components such as an array of LEDs.

Further, the device may be provided with an electrically insulated housing, or an electrically conductive housing connected to ground, so as to protect e.g. a user from electric shocks.

In the present specification, the term "pump" or "pump assembly" may include any device capable of creating a movement, current or flow of a gaseous fluid within and/or through the device. The term is interchangeably used with the terms "fan" or "fan assembly".

Further objectives of, features of and advantages with the present invention will become apparent when studying the following detailed disclosure, the drawings and the appended claims. Those skilled in the art realise that different features of the present invention, even if recited in different claims, can be combined into embodiments other than those described in the following.

BRIEF DESCRIPTION OF THE DRAWINGS

The above, as well as additional objects, features and advantages of the present invention, will be better understood through the following illustrative and non-limiting detailed description of embodiments of the present invention. Reference will be made to the appended drawings, on which.

All the figures are schematic, generally not to scale, and generally only show parts which are necessary in order to elucidate the invention, whereas other parts may be omitted or merely suggested.

DETAILED DESCRIPTION OF EMBODIMENTS

Figure 1:
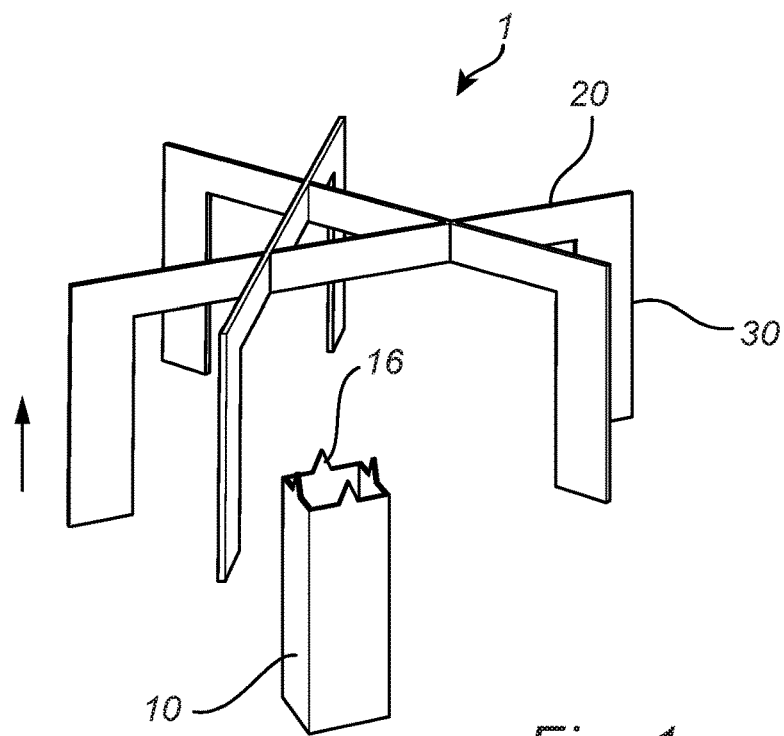
FIG. 1 is a schematic perspective view of a device according to an embodiment of the invention.

FIG. 1 shows a device 1 comprising a first electrode, or emitter 10, and a second electrode, or collector 20, having at least a portion arranged offset from a portion of the emitter 10 in a downstream direction of the flow (indicated by the arrow). According to the present embodiment, the collector 20 is integrated with a thermally conducting flange 30 that may be formed of three electrically conducting sheets of e.g. copper, each extending in a respective plane parallel to the direction of the flow.

The emitter may be formed as a rod 10 having a vertical extension, or maximum height h1, in the direction of the flow and a lateral extension, or maximum width w1, in a direction perpendicular to, or at least intersecting, the direction of the flow. As shown in the present figure, the maximum height h1 is larger than the maximum width w2, hence providing the rod 10 with an elongated shape in the direction of the flow. The rod 10 may also be provided with one or several pointed tips 16 pointing in the direction of the flow, thereby increasing the number of possible emitting points of the emitter.

During operation, the emitter 10 and the collector 20 may be connected to a voltage source (not shown) so as to induce an electric field between the emitter 10 and the collector 20 at least in a direction of the intended flow direction, thereby inducing a motion of the gaseous fluid along said direction. As the fluid passes through the device 1, heat energy carried by the fluid may, upon thermal contact with the flange 30, be transferred to the flange 30 and eventually dissipated to the surroundings of the device 1.

Figure 2A:
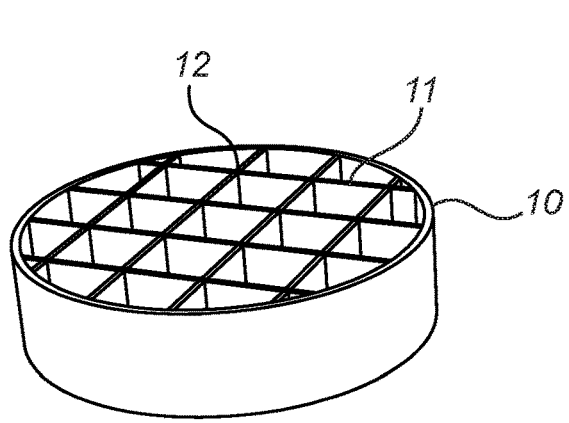
FIGS. 2a-d show perspective views of the first electrode according to an embodiment of the invention.

FIGS. 2a-d show different examples of the first electrode or emitter 10 of a device similar to the device 1 shown in FIG. 1. In FIG. 2a, the emitter 10 may comprise bridges 11 and joints 12 forming a grid that allows a fluid to flow through the emitter 10. The emitter 10 has a lateral extension in a plane perpendicular to the intended flow direction (indicated by the arrow in FIG. 1), whereas at least a portion of at least one of the bridges 11 has a maximum height h1 that is larger than its corresponding width w2.

Figure 2B:
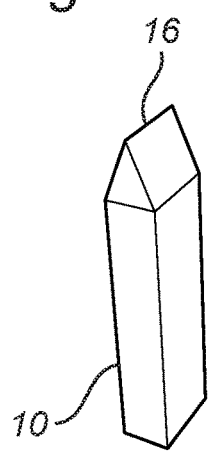
Figure 2C:
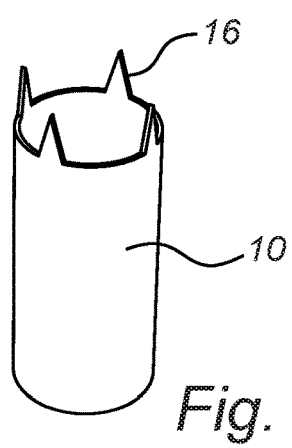
Figure 2D:
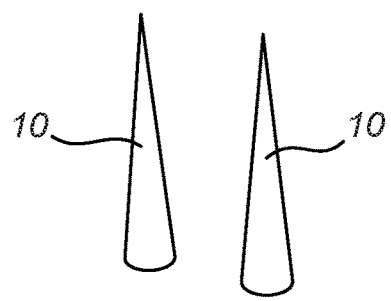

FIG. 2b discloses another example, wherein the emitter 10 is formed as a rod or pillar with a rectangular cross section and a pointed tip. Further, the emitter 10 may be formed as a cylindrical rod having a plurality of tips, as shown in FIG. 2c, and/or comprise one or several needle shaped bodies as shown in FIG. 2d.

Figure 3A:
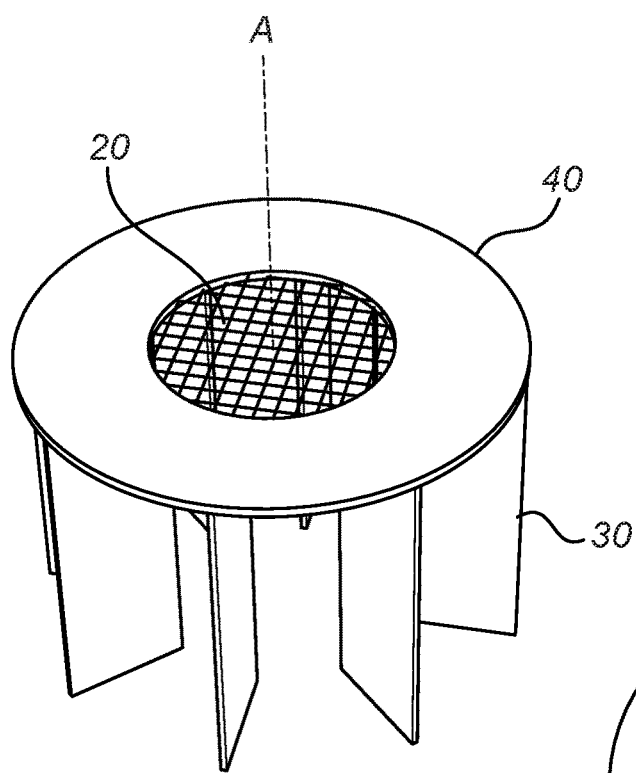
FIGS. 3a and b illustrate flange arrangement and a second electrode according to an embodiment of the invention.
Figure 3B:
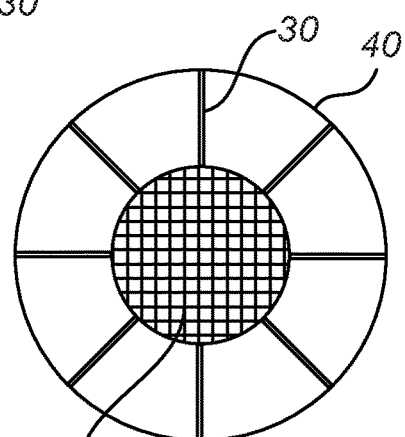

FIGS. 3a and b disclose a device 1 similarly configured to the devices described with reference to FIGS. 1 and 2a-d. The device 1 may comprise a plurality of thermally conducting flanges 30, each of which extending in a respective plane which is parallel to the flow and originates from a common centre axis A of the device 10. Further, a cover or protecting plate 40 may be arranged in a plane intersecting the direction of the flow and at the top end of the flanges 30 (i.e., at a downstream end of the flanges). The cover 40 may be formed as a circular disc having a through-hole for letting the flow pass through the device 1. The collector 20 may be arranged at the top end of the flanges, preferably close to the through-hole, and may e.g. be formed of a net or grid structure similar to the structure of the emitter described with reference to FIG. 2a, or comprise a plurality of wires arranged to extend in a plane intersecting the direction of the flow. Further, the flanges 30 may be adapted to form a space or void extending along a length axis of the device 1 so as to accommodate an emitter 10, which e.g. may be formed as a rod (not shown) adapted to be at least partly inserted in the space or void defined by the flanges 30. FIG. 3a shows a perspective view of such a device 1, whereas FIG. 3b shows a view from below, as seen in the direction of the flow.

Figure 4:
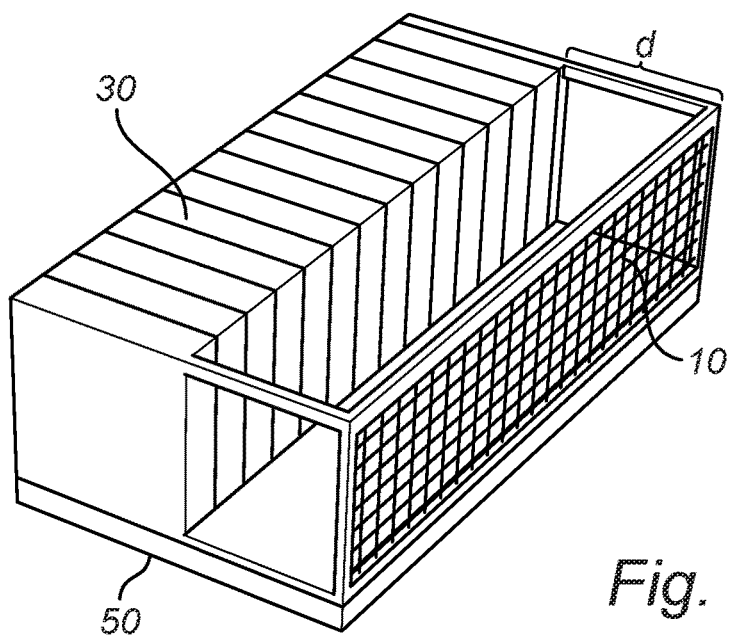
FIG. 4 shows a perspective view of a device according to an embodiment.

FIG. 4 discloses a device according to another embodiment, which may be similarly configured as any one of the devices discussed with reference to the previous figures. The device 1 comprises a collector that may be formed as a lamellar structure of flanges 30 oriented in the direction of the flow (indicated by the arrow). The flanges may e.g. be formed from a planar sheet of a heat conducting and electrically conducting material, such as copper, which may be bent to form a lamellar structure. By the upstream end of the flanges 30, an emitter 10 may be arranged, spaced apart from the flanges by a distance d. The emitter 10 may e.g. form a grid structure as previously discussed, or be formed of one or several wires. The emitter 10 and the collector 20 may be arranged spaced apart from each other in the flow direction by a positive distance d. The spacing may e.g. be maintained by a support structure, or grid spacer being arranged between the emitter 10 and the collector 20. A relatively narrow gap d may be desirable since such gap may provide a relatively high electric field and thus enhance the electrohydrodynamic effect affecting the flow rate.

The emitter 10 and the collector 20 may be attached to a heat transferring element 50 which may be arranged to transfer or dissipate heat from at least one of the emitter 10 and the collector 20. As shown in FIG. 4, the heat transferring element 50 may be formed of a sheet of e.g. metal and may be press-fitted or reflow-soldered into receiving structures in a printed circuit board (not shown). During operation, heat from the passing gaseous fluid may be dissipated from e.g. the collector 20 to the printed circuit board via the heat transferring element 50.

Figure 5A:
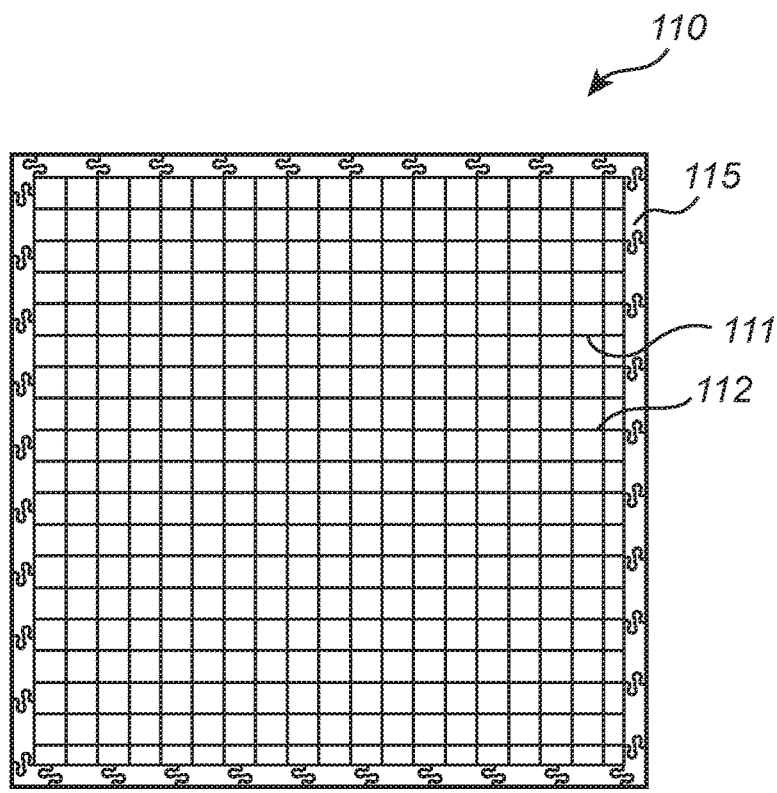
FIGS. 5a and b are top views of an electrode provided with a suspension structure according to embodiments of the invention.

According to some embodiments, the device may comprise a suspension structure adapted to absorb, or prevent, thermally induced deformations of the first electrode and/or the second electrode. The suspension structure, which also may be referred to as a deformation structure, may e.g. be adapted to apply a tensile stress to a length direction of any one of the electrodes, at least a portion of the electrode(s), or a structure formed by the electrode(s). FIG. 5a shows one example of a deformation structure, or suspension structure 115, of a grid acting as e.g. an emitter 110 in a device 100 according to embodiments of the present invention. In this example, the grid may comprise bridges 111 and joints 112 in accordance with the previously described embodiments. As indicated in FIG. 5a, the suspension structure 115 may be composed of bridges 111 that are curved in a plane normal to the flow direction. The curved shape may e.g. be formed during manufacturing of the bridges 111, or induced by e.g. thermal stresses occurring during use of the device 100. The curved shape may also comprise a weakened portion, e.g. a portion having a reduced width, so as to make it easier to deform upon heat induced stresses.

As the material of the grid may expand with an increasing temperature, the bridges 111 of the deformation structure 126 may be compressed by compressive forces acting in the length direction of the bridges 111. By length direction should be understood the direction of extension between a first joint and a second joint. Thereby the lateral expansion of the grid may be absorbed by the deformation structure 115 and thermally induced stresses reduced so that the emitter 110 other than the deformation structure 115 may keep its original shape despite thermal expansion. It should however be understood that the forces acting on the bridges 111 of the deformation structure 115 also, or alternatively, may be caused by e.g. a torsional moment, or torque, acting on the structure.

Figure 5B:
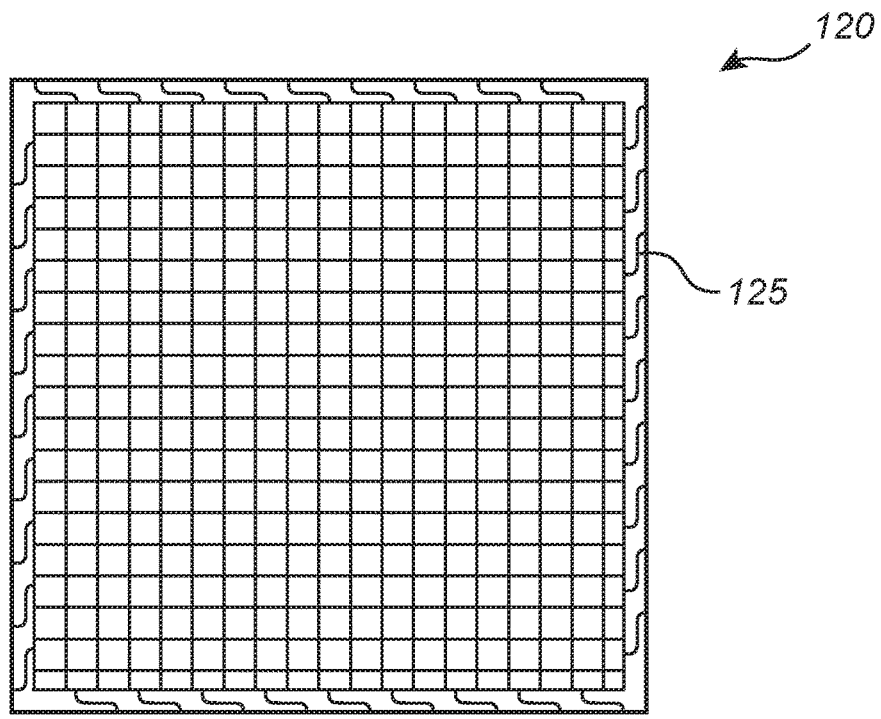

FIG. 5b shows a similar deformation structure 115 as described with reference to FIG. 5a, wherein the suspension structure 115 is adapted to apply a tensile stress to the emitter 110. It will however be understood that the device 100 may be provided with deformation structures 115 arranged in any one, or several, of the emitter 110, the collector 120, and a support structure (not shown).

Figure 6:
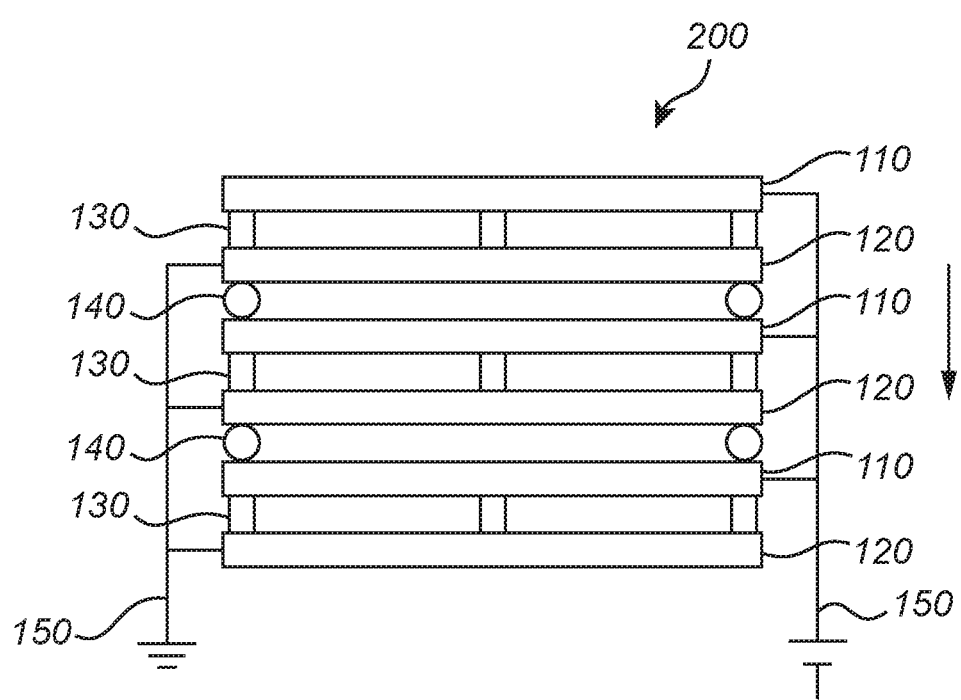
FIG. 6 is a cross section of an assembly, such as a fan assembly, according to an embodiment of the invention.

FIG. 6 shows a cross section of an assembly, such as a fan assembly 200, comprising a stack of three devices 100 according to any one of the previously described embodiments. The cross section is taken along the direction of the flow (indicated by an arrow in FIG. 6). Each device comprises an electron emitting electrode (emitter) 110, an electron collecting electrode (collector) 120, a heat conducting flange (not shown), and a grid spacer 130 arranged to separate the emitter 110 and the collector 120 in the direction of the flow. According to this embodiment, the emitters 110 and collectors 120 may comprise e.g. Pt, Au, or stainless steel forming e.g. the bulk material or a surface coating.

The grid spacer 130 may e.g. be formed as a grid supporting the emitter 110 and the collector 120. As illustrated in FIG. 6, the grid spacer 130 may comprise a peripheral frame to which the edge portions of the emitter 110 and the collector 120 are attached by e.g. welding, soldering or gluing. Alternatively, or additionally, the grid spacer 130 may comprise other spacing structures such as pillars or spacers, etc. The grid spacer 130 may also comprise one or several spacing members, such as e.g. additional bridges or pillars, supporting the centre portions of the emitter and collector. The grid spacer 130 may also comprise a deformation structure 115 (not shown) similar to the deformation structure described with reference to FIGS. 5a and b. The support structure 130 may have a coefficient of thermal expansion (CTE) that differs from the CTE(s) of the emitter 110 and/or collector 120. In case the emitter 110 and/or collector 120 is/are rigidly attached to the support structure 130, the risk for deformations, such as e.g. bending and flexures, and damages such as fractures, disconnected or loosening joints etc. may be reduced by the deformation structure 115. Thereby, reliability and useful life of the device 100 may be increased.

The spacing d of the emitter and collector may be determined by the height of the bridges of the grid spacer 130, which may hence determine the magnitude of the electric field induced between the emitter 110 and the collector 120. The distanced between the emitter 110 and the collector 120 may e.g. be within the range of 0.4 mm and 2 mm.

Further, the grid spacer 130 may comprise an alignment structure for facilitating alignment of the emitter 110 and the collector 120, and/or alignment of the devices 100 of the stack.

The fan assembly 200 may also comprise a stacked structure with stage spacers 140 arranged to maintain a distance between the emitter 110 of a first device and the collector 120 of a second device. The stacking structure 140 may also comprise an alignment structure 142 (not shown in FIG. 6) for facilitating alignment and assemblage of the stacked devices 100, and possibly a deformation structure 115, 125 as described with reference to FIGS. 5a and b in order to reduce any mechanical stresses between the components of the assembly 200.

The grid spacer 130 and/or the stacking structure 140 may e.g. comprise a ceramic material, such as $Al_2O_3$ or Macor™, a plastic material or any suitable electrically insulating material.

As shown in FIG. 6, the emitters 110 and the collectors 120 may be connected to an external voltage supply (not shown) by an electric connector or terminal 150. In this manner, an electric potential difference may be applied between the emitter 110 and collector 120 of the respective devices 100. The electric potential difference may induce an electric field which may promote the electron emission and impart movement of the fluid between and through each of the emitter 110 and collector 120. Further, the electric connection 150 between the emitters 110 and/or collectors 120 and the external power supply may be provided by mechanical features of the stacking structure and/or by electric contact portions 129 (not shown in FIG. 6). The mechanical features may e.g. be adapted so as to enable the electric connection to be formed by e.g. dispensing or screen printing, followed by e.g. sintering or welding. Advantageously, several or all of the emitters 110 and/or collectors 120 of the stack can be connected in the same manufacturing step.

Figure 7A:
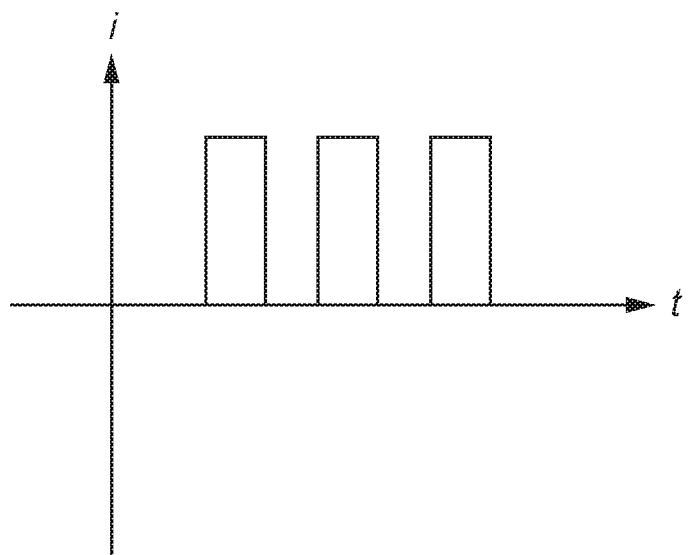
FIGS. 7a and b graphically illustrate electric current pulses applied to the device in accordance with an embodiment of the invention.

FIGS. 7a and b shows, as a function of time t, an electric current i provided to the emitter 110 of a device 100 according to the invention. In FIG. 7a, a positive current is applied and maintained for a first time period, and then removed. After a second time period the current supply is switched on again, thus forming a second pulse. Repeating this procedure can reduce the space charges that may be present in the fluid and may also allow any ionized particles to recombine.

Figure 7B:
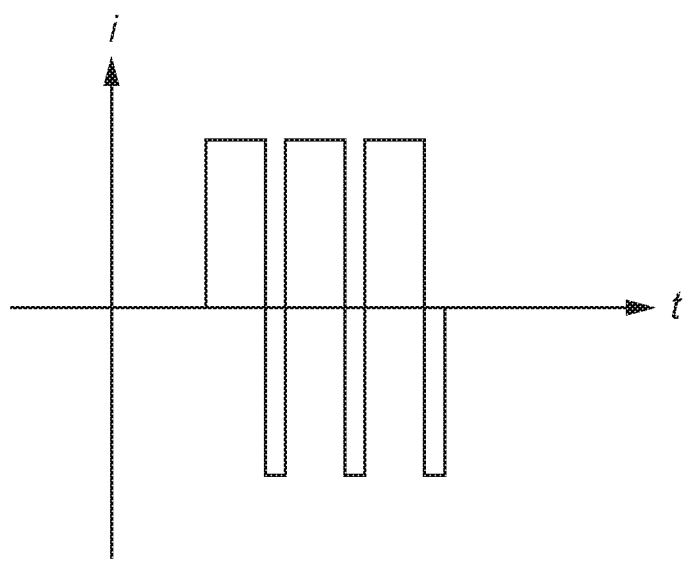

To further improve relaxation, a pulse-reverse current may be introduced between the pulses described with reference to FIG. 7a. An example of such process is shown in FIG. 7b, wherein the positive pulses are separated by negative pulses. As shown in FIG. 7b, the negative pulses may have a larger absolute value than the positive pulses, but last for a shorter period of time so as to enable an overall positive flow. This procedure of separating the positive pulses by reverse pulses may advantageously improve relaxation, possibly to remove contaminants of the emitter 110 and/or collector 120.

The applied electrical potential difference may e.g. depend on the mode of operation of the device. In case of e.g. an injection type mode, the applied electrical potential difference may be comprised in the range of 250-5000 V, depending on the actual distance between the emitter and the collector. In case of e.g. a conduction type mode, the applied potential difference may, for the same actual distance between emitter and the collector, be in the range of 10-500 V.

The injection type mode, or ion drag mode, may be understood as an operational mode of the device wherein a relatively high electric field at the emitter causes electrons to be injected into the gaseous fluid at the interface of the emitter and the gaseous fluid, thus creating a corona of free ions in the gaseous fluid. The conduction mode, on the other hand, can be understood as a mode wherein the electric field is too low to create a substantial corona. Instead, the gaseous flow is caused by impurities or particles in the gaseous fluid, entraining a flow of the fluid.

In one example, the external voltage supply may be controlled in a manner reducing formation of ozone. This may e.g. be achieved by limiting a maximum electric potential difference or electrical charge, and thereby reducing the risk for electrical break-through or sparks. Additionally, or alternatively, a housing, the collector and/or the flange may be adapted to decompose ozone, e.g. by means of a catalytic surface.

As outlined above, the method for controlling the flow of a fluid as illustrated by FIGS. 7a and 7b may be embodied as computer-executable instructions distributed and used in the form of a computer-program product including a computer-readable medium storing such instructions. By way of example, computer-readable media may comprise computer storage media and communication media. As is well known to a person skilled in the art, computer storage media includes both volatile and non-volatile, removable and non-removable media implemented in any method or technology for storage of information such as computer readable instructions, data structures, program modules or other data. Computer storage media (or non-transitory media) includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices. Further, it is known to the skilled person that communication media (or transitory media) typically embodies computer readable instructions, data structures, program modules or other data in a modulated data signal such as a carrier wave or other transport mechanism and includes any information delivery media.

The invention claimed is:

1. A device for controlling a flow of a gaseous fluid, the device comprising:
   a first electrode, wherein at least a portion of the first electrode has a maximum height in a direction parallel to a direction of the flow and a maximum width in a direction orthogonal to the direction of the flow, wherein said maximum height is larger than said maximum width;
   a second electrode, wherein at least a portion of the second electrode is offset from at least a portion of the first electrode in a downstream direction of the flow, the first and second electrodes being connectable to a voltage source; and
   a plurality of thermally conducting flanges extending in a first plane oriented along a direction of the flow, and arranged around at least a portion of the first electrode, whereby the thermally conducting flanges define a volume receiving at least a portion of the first electrode, and the plurality of thermally conducting flanges being adapted to dissipate heat from the gaseous fluid.

2. The device according to claim 1, wherein the first electrode comprises bridges and joints forming a grid structure arranged to allow the gaseous fluid to pass through the first electrode, and wherein said portion of the first electrode forms part of at least one of the bridges.

3. The device according to claim 1, wherein the first electrode is formed as a rod having a height corresponding to the maximum height and a width corresponding to the maximum width.

4. The device according to claim 1, wherein the first electrode is formed as a rod having a circular or polygonal cross section in a plane intersecting the direction of the flow.

5. The device according to claim 3, wherein the rod comprises at least one pointed tip pointing in the direction of the flow.

6. The device according to claim 1, wherein the device comprises a plurality of mutually intersecting thermally conducting flanges.

7. The device according to claim 1, wherein the second electrode is electrically connected to the plurality of thermally conducting flanges.

8. The device according to claim 1, wherein the second electrode is integrally formed with the plurality of thermally conducting flanges.

9. The device according to claim 1, wherein a distance between the second electrode and the first electrode in the direction of the flow is between 0.4-2.0 mm.

10. A method for manufacturing a device for controlling a flow of a gaseous fluid, the method comprising:
    providing a first electrode, the first electrode comprising at least a portion having a maximum height in a direction parallel to the direction of the flow and a maximum width in a direction orthogonal to the direction of the flow, and wherein said maximum height is larger than said maximum width;
    providing a second electrode, the second electrode comprising a portion which is formed as a thermally conducting flange extending in a plane parallel to a direction of the flow and being adapted to dissipate heat from the gaseous fluid;
    providing, on at least one of the first electrode or the second electrode, a suspension structure, wherein the suspension structure is arranged in a plane orthogonal to the direction of the flow for absorbing thermally induced deformations in the first electrode or the second electrode; and
    arranging the second electrode offset from the first electrode in the direction of the flow.

11. The method according to claim 10, wherein first and/or second electrode(s) is/are provided by selectively depositing a metal.

12. The method according to claim 10, wherein first and/or second electrode(s) is/are provided by selectively removing material from a metal substrate.

13. A method for controlling a flow of a gaseous fluid, the method comprising:
    providing a first electrode of a device, the first electrode comprising at least a portion having a maximum height in a direction parallel to the direction of the flow and a maximum width in a direction orthogonal to the direction of the flow, and wherein said maximum height is larger than said maximum width;
    providing a second electrode of the device, the second electrode comprising a portion which is offset from at least a portion of the first electrode in a downstream direction of the flow and being adapted to dissipate heat from the gaseous fluid;
    providing a plurality of thermally conducting flanges extending in a first plane oriented along a direction of the flow, arranged around at least a portion of the first electrode, whereby the thermally conducting flanges define a volume receiving at least a portion of the first electrode, and the plurality of thermally conducting flanges being adapted to dissipate heat from the gaseous fluid;

arranging the second electrode offset from the first electrode in the direction of the flow;
providing the gaseous fluid that contacts the first electrode of the device; and
applying an electric potential difference between the first electrode and the second electrode.

14. The method according to claim 13, further comprising the step of varying the electric potential difference as a function of time.

15. The method according to claim 13, wherein the applied electric potential difference is comprised in the range of 400-4000 V.

16. The method according to claim 13, wherein the applied electric potential difference is comprised in the range of 100-400 V.

* * * * *